(12) United States Patent
Buhler et al.

(10) Patent No.: US 7,923,702 B2
(45) Date of Patent: Apr. 12, 2011

(54) SYSTEM AND METHOD FOR PROCESSING AN OBJECT

(75) Inventors: Wolfram Buhler, Hermaringen (DE); Alexander Rosenthal, Aalen (DE); Emmerich Bertagnolli, Vienna (AT); Heinz Wanzenbock, Vienna (AT); Markus Fischer, Trondheim (NO); Gottfried Hochleitner, Vienna (AT)

(73) Assignee: Carl Zeiss NTS GmbH, Oberkochen (DE)

( * ) Notice: Subject to any disclaimer, the term of this patent is extended or adjusted under 35 U.S.C. 154(b) by 166 days.

(21) Appl. No.: 12/268,802

(22) Filed: Nov. 11, 2008

(65) Prior Publication Data

US 2009/0152459 A1 Jun. 18, 2009

(30) Foreign Application Priority Data

Nov. 13, 2007 (DE) .......................... 10 2007 054 073

(51) Int. Cl.
  *C23C 16/458* (2006.01)
  *C23C 16/48* (2006.01)
  *H01J 49/00* (2006.01)
(52) U.S. Cl. .................. 250/440.11; 250/306; 250/307; 250/310; 250/311; 250/441.11
(58) Field of Classification Search .................. 250/306, 250/307, 310, 311, 440.11, 441.11, 442.11, 250/492.1, 492.22
See application file for complete search history.

(56) References Cited

U.S. PATENT DOCUMENTS

| | | | |
|---|---|---|---|
| 4,197,455 A | | 4/1980 | Blanchard et al. |
| 4,818,326 A * | | 4/1989 | Liu et al. ................. 156/345.36 |
| 4,820,377 A * | | 4/1989 | Davis et al. ..................... 134/1.1 |
| 4,822,450 A * | | 4/1989 | Davis et al. ..................... 438/709 |
| 5,055,696 A * | | 10/1991 | Haraichi et al. ............ 250/492.2 |
| 5,148,024 A | | 9/1992 | Watanabe |
| 5,429,730 A * | | 7/1995 | Nakamura et al. ........ 204/192.34 |
| 5,435,850 A | | 7/1995 | Rasmussen |
| 5,616,921 A | | 4/1997 | Talbot et al. |
| 5,639,699 A * | | 6/1997 | Nakamura et al. ............. 427/527 |
| 6,538,254 B1 * | | 3/2003 | Tomimatsu et al. ...... 250/442.11 |
| 6,627,889 B2 * | | 9/2003 | Ochiai et al. ....................... 850/9 |
| 6,794,663 B2 * | | 9/2004 | Shichi et al. ............. 250/492.21 |
| 6,828,566 B2 * | | 12/2004 | Tomimatsu et al. ...... 250/442.11 |
| 6,855,929 B2 * | | 2/2005 | Kimba et al. ...................... 850/9 |

(Continued)

FOREIGN PATENT DOCUMENTS

CA 2 354 956 A1 2/2002

(Continued)

OTHER PUBLICATIONS

Bret, T., "Physico-Chemical Study of the Focused Electron Beam Induced Deposition Process," Dissertation No. 3321, Lausanne EPFL, Switzerland, 2005, pp. 1-220.

(Continued)

*Primary Examiner* — David A Vanore
(74) *Attorney, Agent, or Firm* — Potomac Patent Group PLLC

(57) ABSTRACT

A system and a method for processing and inspecting an object are provided, wherein the system comprises a particle beam column, an object holder and a gas supply apparatus. Thereby, the object holder is formed comprising a base, a first table displaceable relative to the base, a second table displaceable relative to the first table and a third table rotatable relative to the second table, wherein the cannula of the gas supply apparatus is fixed at the first table.

19 Claims, 12 Drawing Sheets

U.S. PATENT DOCUMENTS

Figure 1:
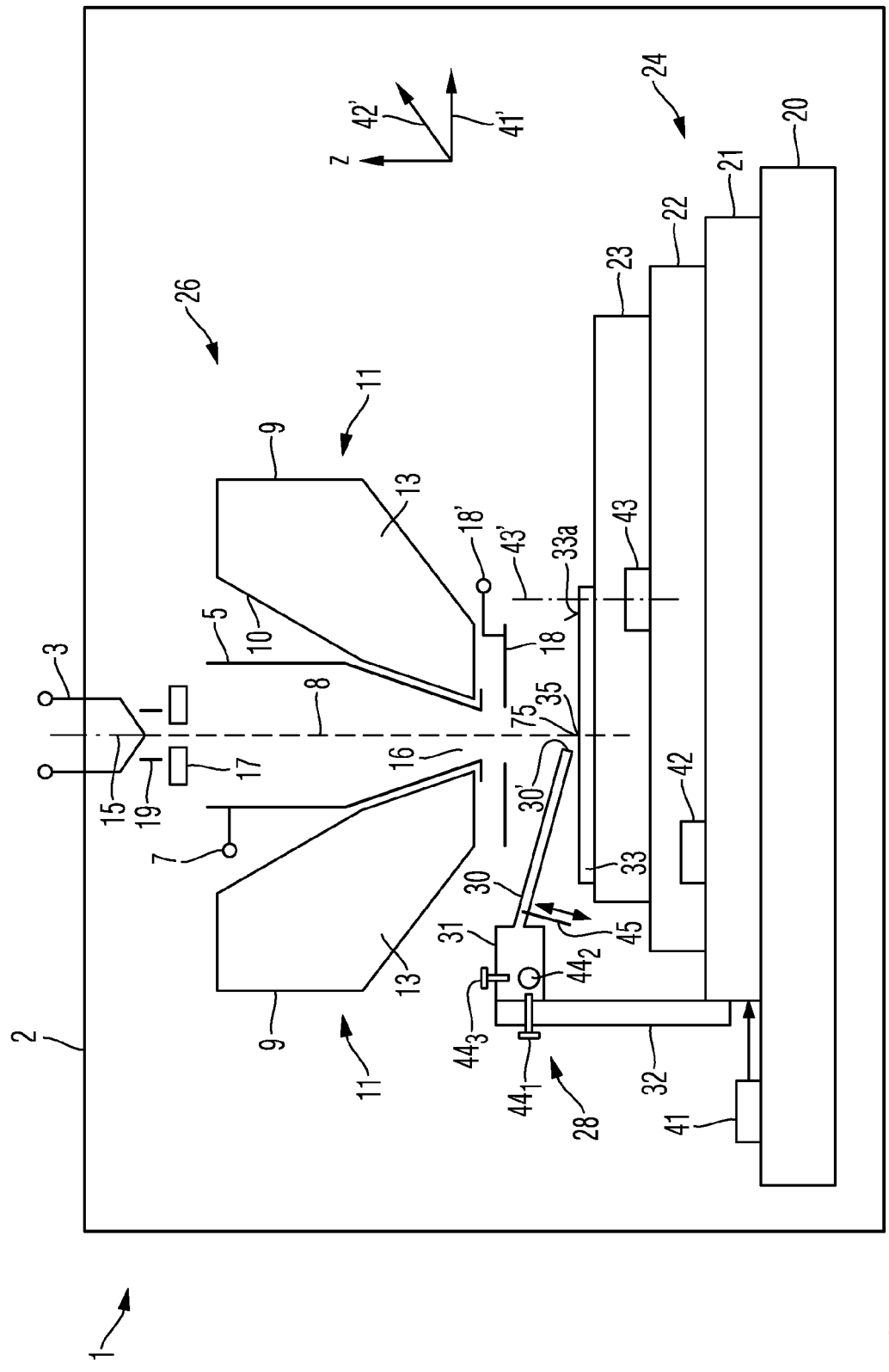

| | | | |
|---|---|---|---|
| 6,992,290 B2* | 1/2006 | Watanabe et al. | 250/310 |
| 7,244,932 B2* | 7/2007 | Nakasuji et al. | 250/306 |
| 7,268,356 B2* | 9/2007 | Shichi et al. | 250/492.21 |
| 7,525,108 B2* | 4/2009 | Tomimatsu et al. | 250/492.21 |
| 2002/0152797 A1 | 10/2002 | McAndrew et al. | |
| 2002/0190036 A1 | 12/2002 | McCay et al. | |
| 2004/0043621 A1 | 3/2004 | Nasser-Ghodsi | |
| 2004/0173759 A1 | 9/2004 | Koops et al. | |
| 2005/0103272 A1* | 5/2005 | Koops et al. | 118/723 EB |
| 2005/0167614 A1* | 8/2005 | Kaito | 250/492.21 |
| 2006/0225998 A1* | 10/2006 | Song | 204/192.11 |
| 2009/0121132 A1* | 5/2009 | Koops et al. | 250/307 |
| 2009/0152459 A1* | 6/2009 | Buhler et al. | 250/306 |
| 2010/0072364 A1* | 3/2010 | Wang et al. | 250/307 |
| 2010/0102223 A1* | 4/2010 | Albiez et al. | 250/307 |

FOREIGN PATENT DOCUMENTS

| | | |
|---|---|---|
| DE | 40 29 483 C1 | 5/1991 |
| DE | 41 10 118 A1 | 10/1991 |
| DE | 44 21 517 A1 | 1/1995 |
| DE | 10208043 A1 | 9/2003 |
| EP | 0 483 517 A2 | 5/1992 |
| EP | 1 411 538 A1 | 4/2004 |
| FR | 2 408 909 | 6/1979 |
| JP | 2002-134057 A | 5/2002 |
| JP | 2003-308801 A | 10/2003 |
| KR | 10-2002-0014761 A | 2/2002 |
| WO | WO 97/49116 A1 | 12/1997 |
| WO | WO 2006/025968 A2 | 3/2006 |

OTHER PUBLICATIONS

Ray, V., "Gas Delivery and Virtual Process Chamber Concept for Gas-Assisted Material Processing in a Focused Ion Beam System," Journal of Vacuum Science and Technology B: Micoelectronics and Nanometer Structures, vol. 22, No. 6, Nov. 2004, pp. 3008-3011.

Theil, J. A., "Gas Distribution Through Injection Manifolds in Vacuum Systems," Journal of Vacuum Science & Technology A: Vacuum, Surfaces, and Films, vol. 13, No. 2, Mar. 1995, pp. 442-447.

Maszara, W. P., et al., "Bonding of Silicon Wafers for Silicon-on-Insulator," J. Appl. Phys. 64 (10), Nov. 15, 1988, pp. 4943-4950.

Wiegand, M., et al., "Wafer Bonding of Silicon Wafers Covered with Various Surface Layers," Sensors and Actuators 86 (2000), pp. 91-95.

Taraschi G., et al., "Strained Si, SiGe, and Ge On-Insulator: Review of Wafer Bonding Fabrication Techniques," Solid-State Electronics 48, 2004, pp. 1297-1305.

Koops et al., "High-resolution electron-beam induced deposition" Journal of Vacuum Science and Technology: Part B, AVS/AIP, Melville, NY, vol. 6, No. 1, Jan. 1, 1988, pp. 477-481, XP000616834, ISSN: 1071-1023.

European Search Report issued in corresponding European Application No. 08019703.1-2208/2061066 on Dec. 8, 2010.

\* cited by examiner

SYSTEM AND METHOD FOR PROCESSING AN OBJECT

Related Applications

This application claims priority and benefit from German patent application No. 10 2007 054 073.8, filed Nov. 13, 2007, the entire teachings of which are incorporated herein by reference.

The present invention relates to a system and a method for processing an object. In particular, this invention relates to a system and a method for processing an object, wherein a reaction gas is activated using a particle beam. Further, this invention relates to a system and a method for processing an object, wherein depositions of materials on a surface of an object or ablations of materials from the surface of the object may be performed by the reaction gas activated by the particle beam.

From the state of the art material processing systems are known, wherein a reaction gas is supplied to a processing portion of an object, wherein molecules or elements of this reaction gas adsorb on a portion of the surface of the object and wherein the molecules or elements adsorbed at the surface are activated by an activation beam, to provoke reactions at the surface or with components of the surface of the object. Thereby, depending of used reaction gas and material present at the surface of the object, depositions of material onto the surface of the object or ablations of material from the surface of the object may be selectively performed. Thereby, the activation beam may comprise an electron beam, an ion beam, a light beam or a combination of the former. The described material processing system may be utilized for processing or manufacturing microstructures on an object. A field of utilization lies in the processing of masks for optical lithography for the manufacturing of integrated circuits in the semiconductor industry or in the manufacturing and processing of stamps for nanoimprints. Due to an unsatisfactory processing accuracy it is often necessary, to further process masks, to achieve a required accuracy of a microstructuring. A precise microstructuring of such masks is necessary to enable manufacturing higher and higher integrated and thus finer structured semiconductor components. A further utilization or application of processing systems employing a reaction gas activated by an activation beam lies in "direct write" techniques of microstructures.

From the document DE 102 08 043 A1 a material processing system is known, wherein an electron beam activates a gas supplied by a gas supply arrangement to the surface of the object, to cause a deposition and an ablation of material, respectively. For supplying the reaction gas thereby a cannula is provided and arranged close to an object field of the electron microscope. This object field in turn corresponds to a to be processed location of the object. Thereby, the gas supply apparatus of this mentioned system is very complex, of large dimension and requires a complicated controller to supply reaction gas and to prohibit supply of reaction gas, when the object is to be inspected using the electron beam upon absence of a reaction gas after processing.

Thus, it is an object of the present invention to provide a system and a method for processing an object being capable to selectively perform depositions and ablations, respectively, at defined locations of the object using a reaction gas activated by a particle beam. A further object of the present invention is to provide a processing system for processing an object that allows besides a locally defined processing the object and inspecting the object to monitor and control a processing progress and/or a processing condition.

Still a further object of the present invention is, to provide a material processing system and a material processing method, wherein a cost-efficient, small-dimensioned gas supply apparatus is utilized that may be integrated into a given particle microscope, such as an electron microscope, in a simple manner.

According to an embodiment of the present invention a system for processing an object is provided, wherein the system comprises a particle beam column having an objective lens; an object holder for positioning an object to be processed in front of the objective lens; and a gas supply apparatus having a cannula for supplying gas to the object positioned in front of the objective lens. Thereby, the object holder comprises a base stationary with respect to the particle beam column, a first table mounted at the base and translationally displaceable relative to the base in a first direction, a second table mounted at the first table and translationally displaceable relative to the first table in a second direction and a third table mounted at the second table and displaceable, in particular rotatable, relative to the second table. Thereby, the cannula is fixed at the first table.

The cannula comprises a fine tube having a round, such as circular, elliptical, or angled, such as quadratic or rectangular, or irregular cross-sectional shape. The particle beam column comprises a particle source for generating a beam of charged particles, deflection and focussing plates for deflecting the particle beam, a beam tube connected to a voltage source to accelerate the particles, an objective lens capable to focus the particle beam to a location of the object, as well as at least one detector to detect particles emanating from the object, such as electrons, ions or photons. In particular, the detector may be an electron detector to detect electrons emanating from the object. Thereby, depending on the application, the electron detector may be arranged inside or outside of the objective lens. The electron detector may be adapted to detect electrons having different characteristics, such as secondary electrons and/or backscattered electrons, or there may be provided plural electron detectors being adapted, possibly utilizing an energy selector, to separately detect secondary electrons and backscattered electrons. The components of the particle beam column may be controlled by a controller to perform processing the object at a location and to acquire a microscopic image, in particular an electron microscopic image, of the particular location of the object. Thereby, the particle beam may scan across an area of the surface of the object, while the detector(s) detect(s) particles emanating from the object, to acquire a microscopic image. In particular one or more electron detectors may detect electrons emanating from the object, to acquire an electron microscopic image of the area of the object.

According to an embodiment of the present invention the object is mounted on a third table, wherein the third table is displaceable relative to the second table, wherein the second table is displaceable relative to the first table, wherein the first table is displaceable relative to a base. Each one of these first, second and third tables thereby may be configured as a combination of tables, which in turn are displaceable relative to each other. Thereby, the first table is translationally displaceable relative to the base in a first direction and the second table is translationally displaceable relative to the first table in a second direction. Thereby, the first direction and the second direction are not parallel to each other. It may be advantageous to choose the second direction substantially orthogonal to the first direction, an included angle may also amount to 30°, 45° or 60°. Depending upon the application it may be advantageous to choose a direction of the rotation axis of the third table parallel to a direction of the particle beam provided by the particle beam column. For other applications it may be advantageous to design the aforementioned directions to be not parallel.

According to an embodiment of the present invention the processing system further comprises a first actuator to displace the first table relative to the base. This first actuator may be controlled by a controller to allow a desired positioning of the first table relative to the base. An actuator in the context of this application may be designed as mechanical, pneumatic or motor-driven actuator. In particular applications the actuator may allow a manually mechanically positioning the corresponding table.

According to an embodiment of the present invention the processing system further comprises a second actuator to displace the second table relative to the first table. Also this second actuator may be controlled by a controller to allow a desired positioning of the second table relative to the first table.

According to an embodiment of the present invention the material processing system further comprises a third actuator to displace the third table relative to the second table. Also this third actuator may be controlled by a controller to allow a desired positioning of the third table relative to the second table.

According to an embodiment of the present invention at least one of the first, the second and the third actuator may be actuated during operation of the particle beam column. Thereby it is possible during operation to align an object field of the particle beam column with a to be processed portion of the surface, as well as to have the cannula of the gas supply apparatus close to this portion and to remove it from this portion, respectively. Thus, a processing and an inspection of the object, respectively, may be performed, without necessarily requiring to control the flow of reaction gas from the cannula of the gas supply apparatus. As soon as the particle beam is directed to a particular location of the object, processing may be performed by displacing the cannula of the gas supply apparatus in proximity of the location to be processed and inspecting this portion of the object may be performed by removing the cannula of the gas supply apparatus from the location to be processed.

According to an embodiment of the present invention a position or/and orientation of the cannula relative to the first table is adjustable. Such an adjustment of a position or/and of an orientation of the cannula is normally not necessary during operation of the particle beam column. Thereby, a magnitude of such a positional change or/and orientational change of the cannula relative to the first table is considerably smaller, such as by a factor 10 to 100, than a magnitude of a positional change of the first table relative to the base. Such an adjustment of a position and/or orientation of the cannula relative to the first table thus is provided for the purpose of an initial adjustment of the processing system.

According to an embodiment of the present invention the gas supply apparatus comprises a substance reservoir for accommodation of a reserve of a substance which may be supplied via the cannula in a form of gas. Thus, a substantially autarcic gas supply apparatus may be provided which may be accommodated in its entirety within a vacuum vessel. Thus, no gas pipes from reserve vessels located outside the vacuum vessel to the gas supply apparatus located inside of the vacuum vessel are required. Thus, a compact gas supply apparatus may be provided that may be installed within an existing particle microscope, such as an electron microscope, in a simple manner. According to an embodiment thereby also no separate controller of a gas flow through the cannula of the gas supply apparatus is required. Gas supply from outside the vacuum vessel is an alternative technical possibility. The substance reservoir may comprise an apparatus for cooling and/or heating to appropriately temper the substance contained therein, for example for controlling gas flow through the cannula. The gas to be supplied may thereby evolve from solids that sublime; liquids having a sufficiently high vapour pressure; and gases that may be stored in a container having a small aperture.

According to an embodiment of the present invention the particle beam column and the substance reservoir are arranged within a common vacuum vessel.

According to an embodiment of the present invention the substance reservoir is mounted at the first table together with the cannula. Thereby, a particularly compact gas supply apparatus is provided which may be installed in an existing electron microscope in a simple way. Further, the substance reservoir may be mounted at a wall of the vacuum vessel, wherein a gas pipe, such as a tube, is guided from the substance reservoir to the cannula.

According to an embodiment of the present invention the gas supply apparatus comprises a locking valve arranged between the substance reservoir and the cannula. The locking valve may be controlled by a controller outside the vacuum vessel to perform processing a location of the object while the locking valve is open and to perform inspecting the location of the object, while the locking valve is closed, even better.

According to an embodiment of the present invention the locking valve comprises an actuator to actuate the locking valve during operation of the particle beam column. Also, a mechanical valve may be provided allowing the locking only for an opened vacuum vessel or outside the vacuum vessel.

According to an embodiment of the present invention a processing method is provided comprising: positioning a portion of an object in an object field of a particle beam column, wherein an exit opening of a cannula is arranged close to the object field; processing the object by supplying gas via the cannula and activating the gas using the particle beam column; completing the processing the object by moving away the cannula such that its exit opening is arranged spaced apart from the object field of the particle beam column; positioning the portion of the object in the object field of the particle beam column, wherein the exit opening of the cannula is arranged spaced apart from the object field; and acquiring a microscopic image of the portion of the object using the particle beam column.

Thereby, a particle beam is directed to a portion of the object and a gas nozzle or exit opening is adjusted such that sufficient reaction gas is provided at the portion of the object by flow out of the nozzle. Thus, the portion of the object may be processed after activating the gas using the particle beam column comprising ablating of material and/or depositing of material. The processing the object is completed by moving away the cannula such that its exit opening is not anymore arranged in proximity to a point of impingement of the particle beam. Thereby, also the object may synchronously be moved away so that another portion of the object is hit by the particle beam. To perform inspection of the portion of the object the object is displaced to let the particle beam again impinge onto this portion of the object. Thus, a microscopic image, such as an electron microscopic image, of this portion of the object may be acquired without processing this portion, since reaction is not present in a sufficient amount close to this portion.

The acquiring the microscopic image may comprise scanning the particle beam, in particular an ion or electron beam, across the portion of the object as well as detecting particles emanating from the surface of the object, such as ions, electrons or photons.

According to an embodiment of the present invention during the processing the object and during the acquiring the electron microscopic image gas exits from the cannula. Thus, this embodiment of the inventive method does not require to control a flow of gas out of the cannula. A selection between a processing the object and an acquiring the microscopic image instead is performed by correspondingly displacing the cannula relative to the portion of the object and displacing the particle beam relative to the portion.

According to an embodiment of the present invention the cannula is made of non-magnetizable material being chemically inert and the cannula may be metal-coated at its surface to avoid charging (for example a gold-coated glass or teflon tube).

According to an embodiment of the inventive processing system is used for performing the inventive processing method.

The invention will now be explained with reference to the accompanying drawings. In the Figs.

Figure 2A:
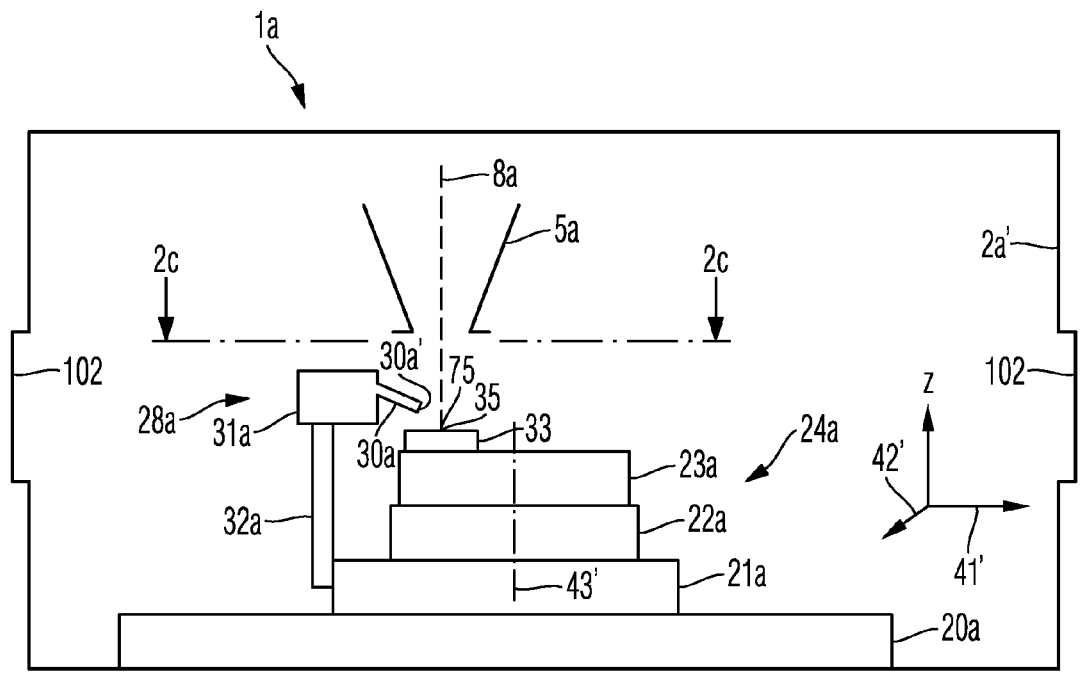
Figure 2C:
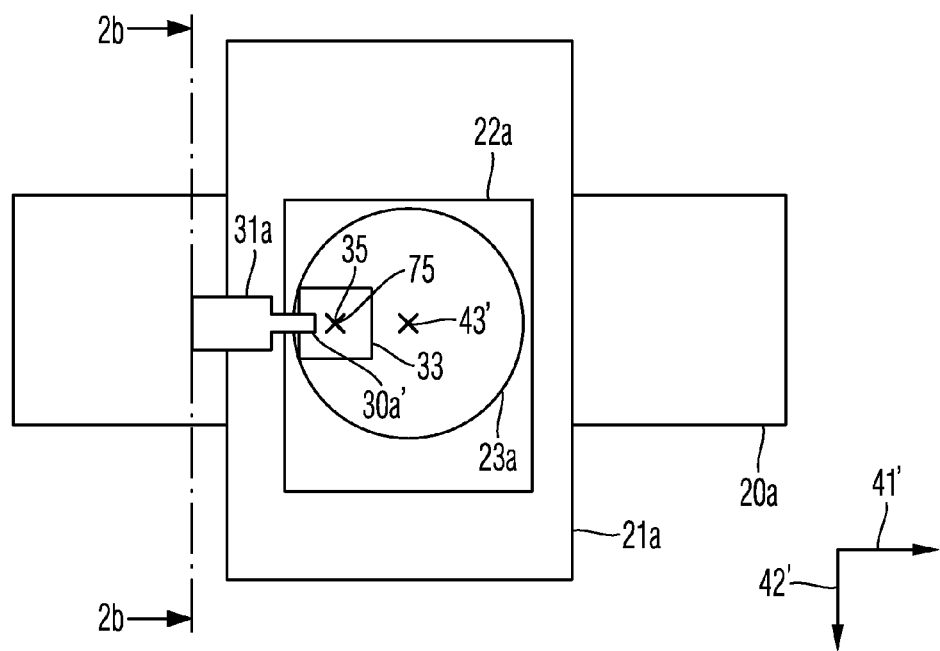
Figure 3A:
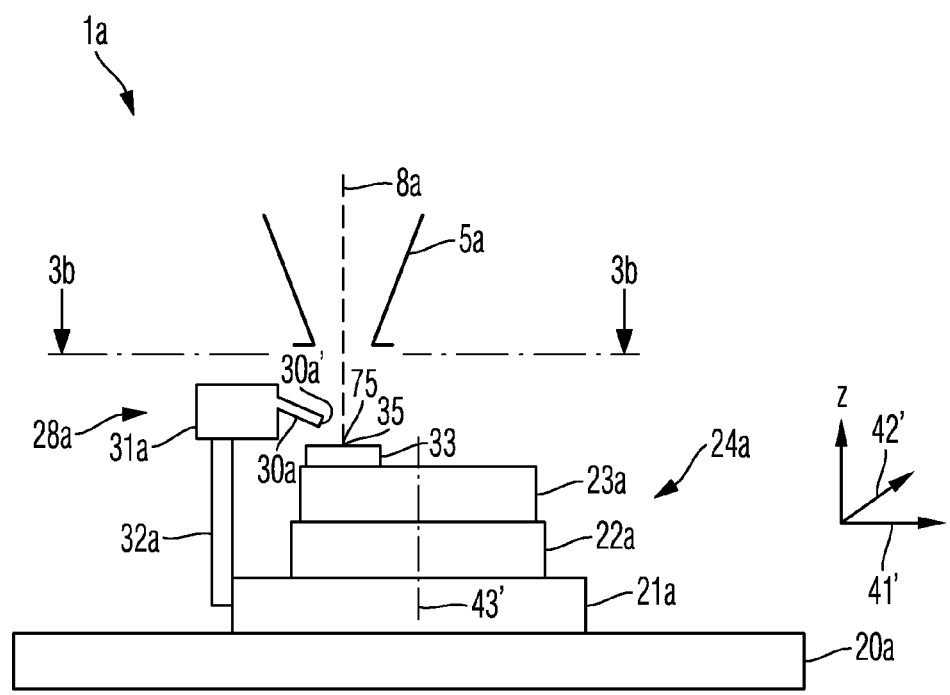
Figure 3B:
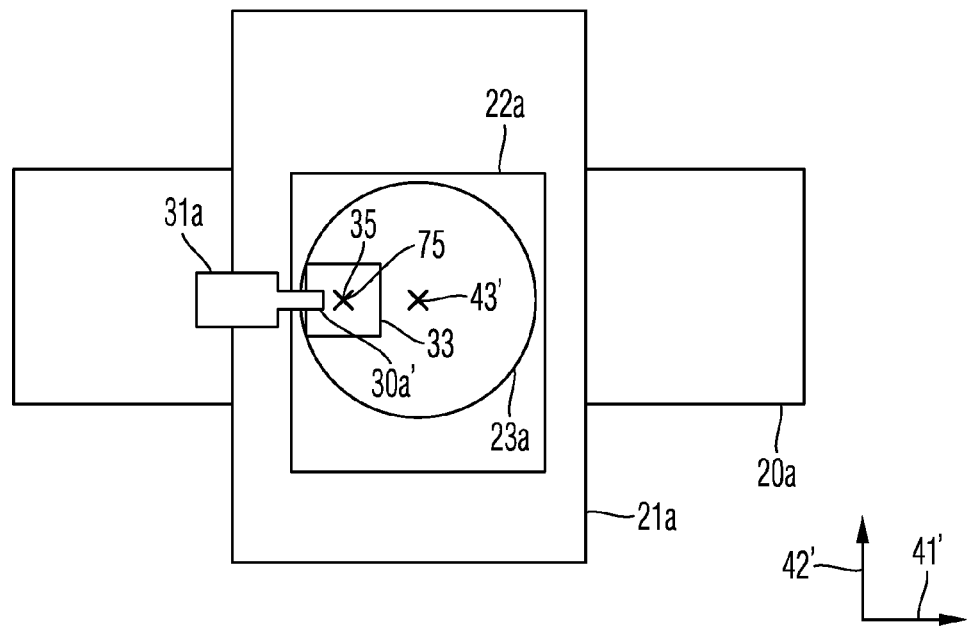
Figure 3C:
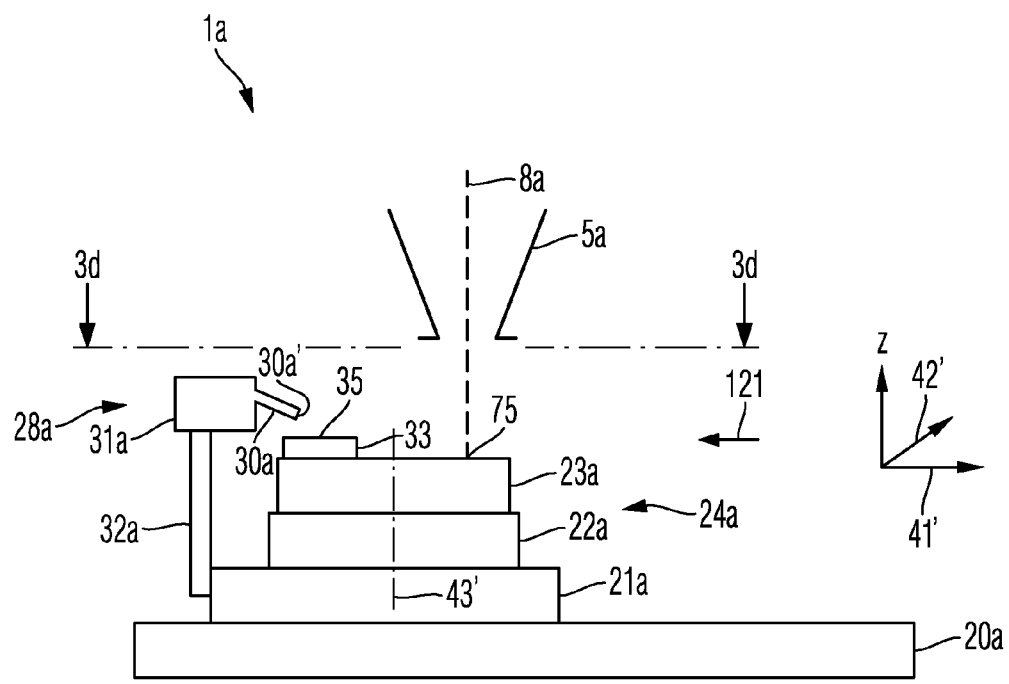
Figure 3D:
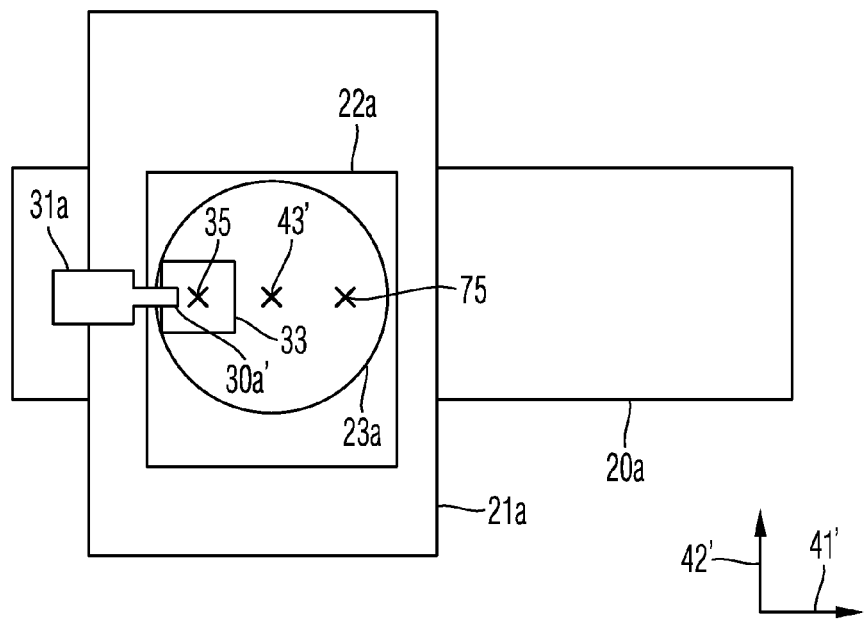
Figure 3E:
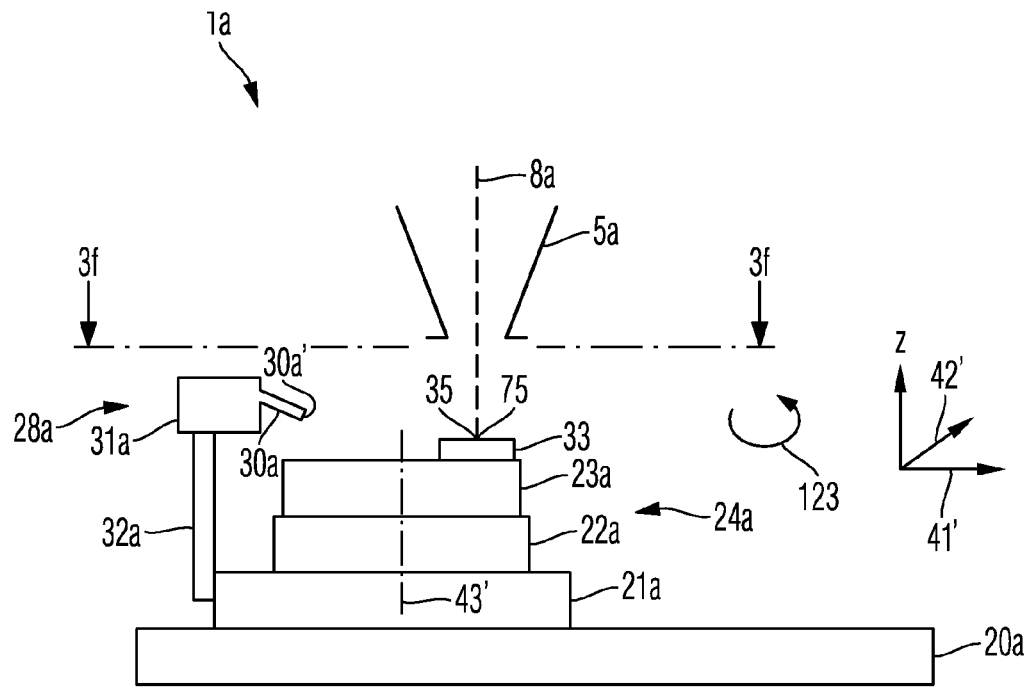
Figure 3F:
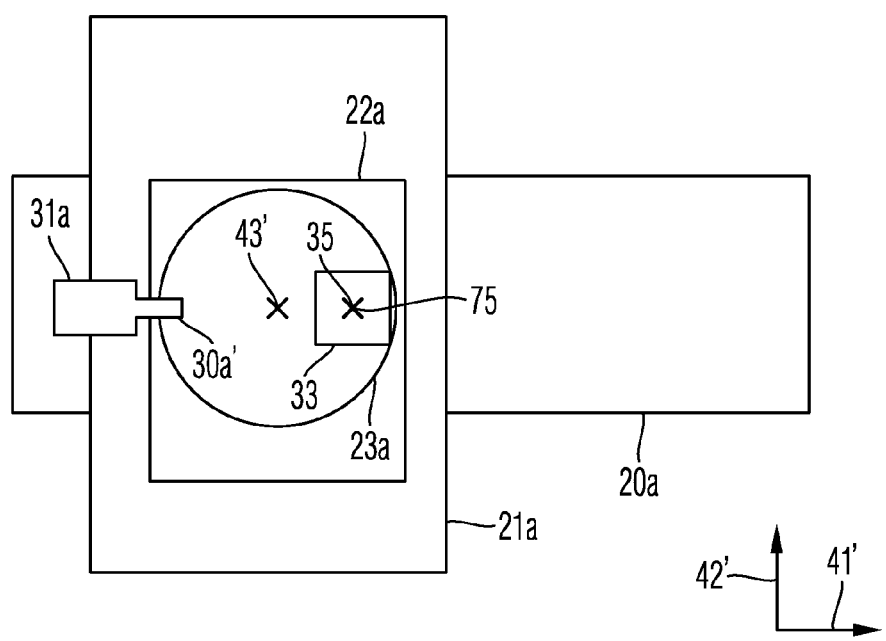
Figure 4A:
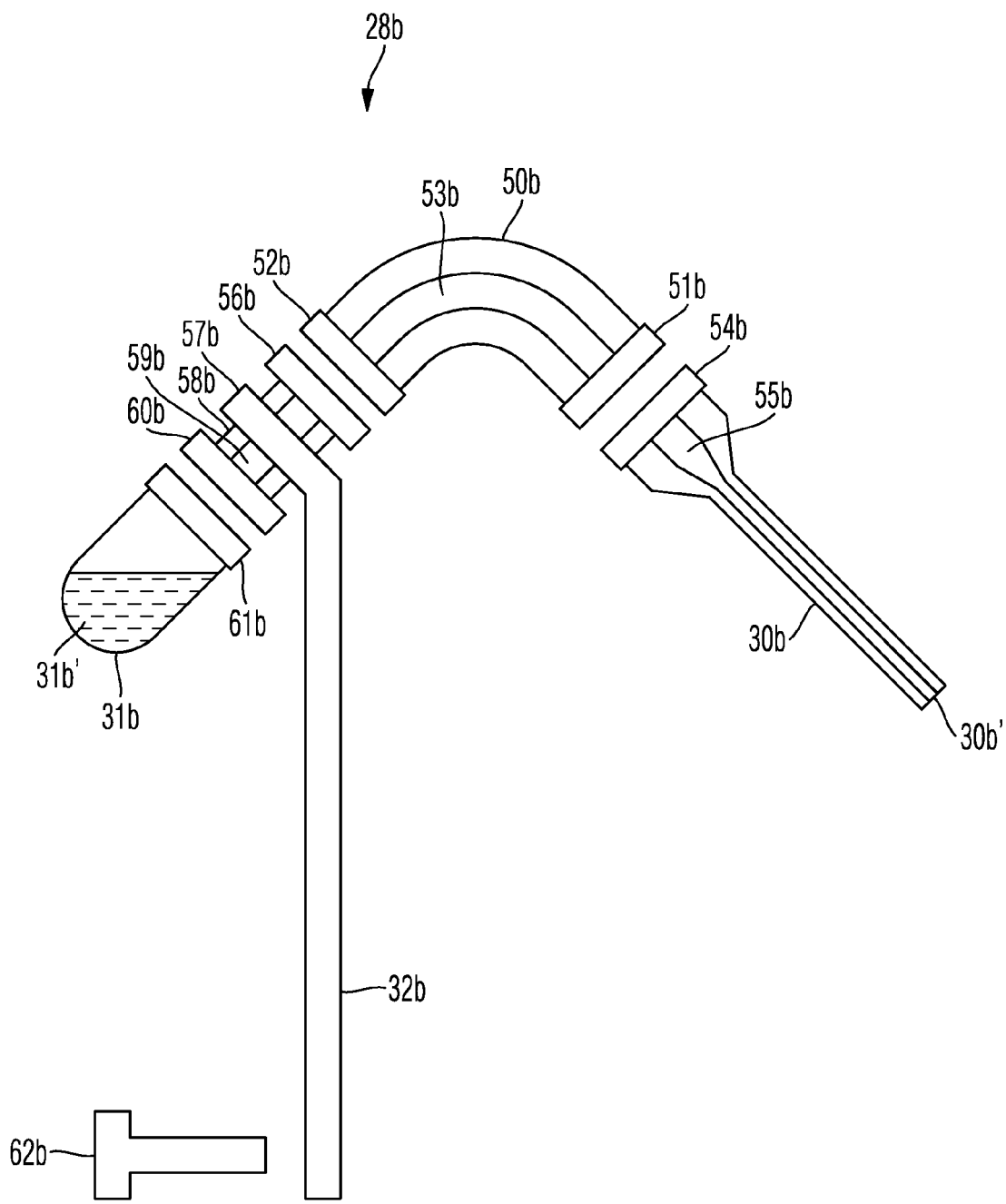
Figure 4B:
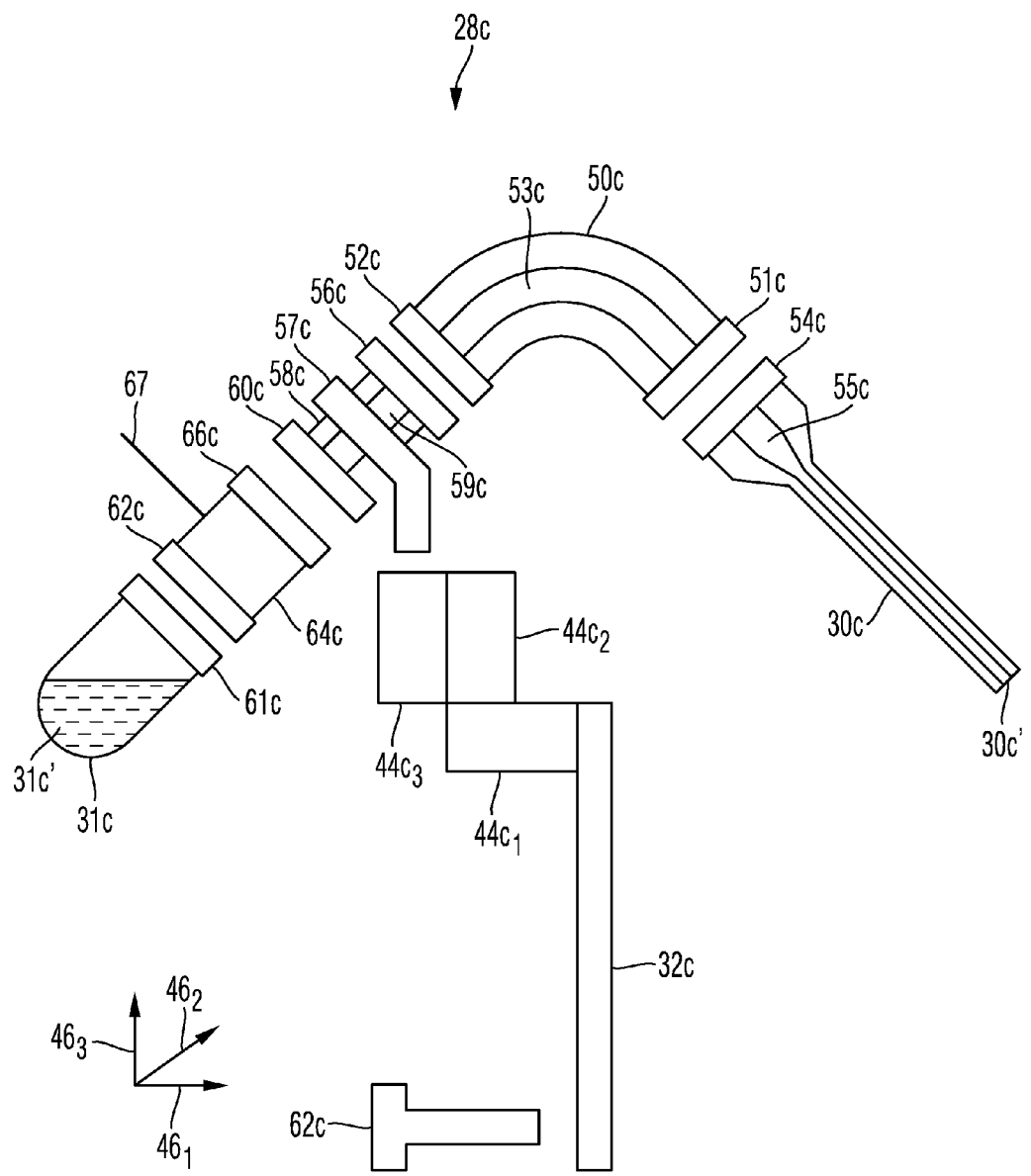
Figure 5A:
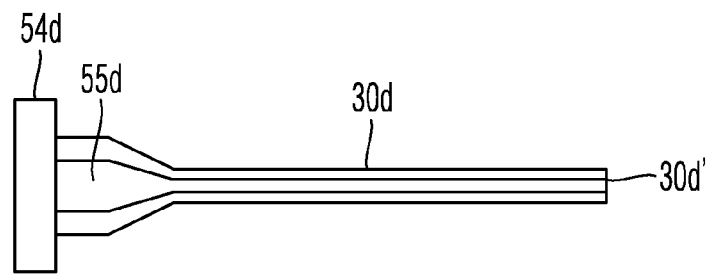
Figure 5B:
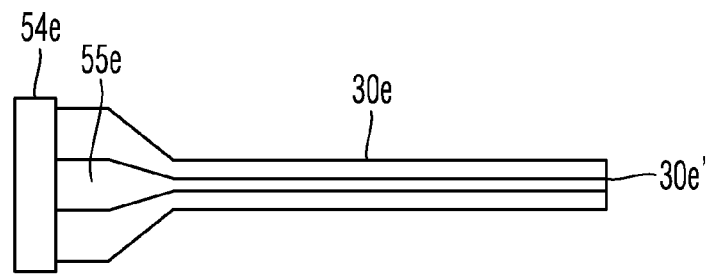
Figure 5C:
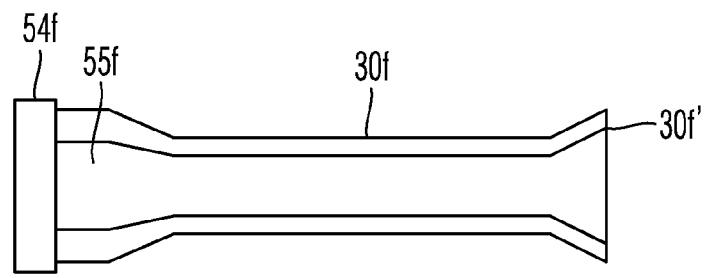
Figure 5D:
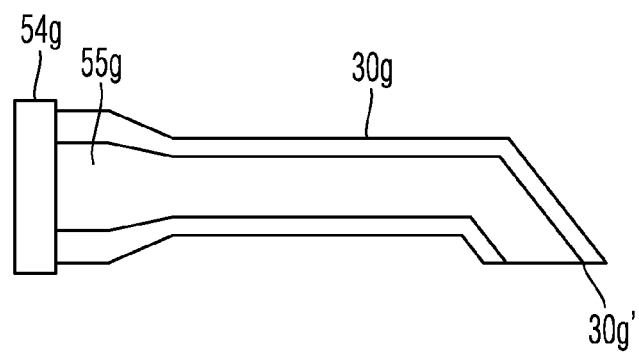

FIG. 1 shows an embodiment of a processing system according to the present invention,

FIG. 2a,

FIG. 2b,

FIG. 2c respectively show a view from different directions of an embodiment of a processing system according to the present invention,

FIG. 3f show steps of an embodiment of a processing method according to the present invention,

FIG. 4a,

FIG. 4b respectively show embodiments of a gas supply apparatus according to the present invention,

FIG. 5d respectively show an embodiment of a cannula, which may be utilized in embodiments of a processing system according to the present invention, and

Figure 6A:
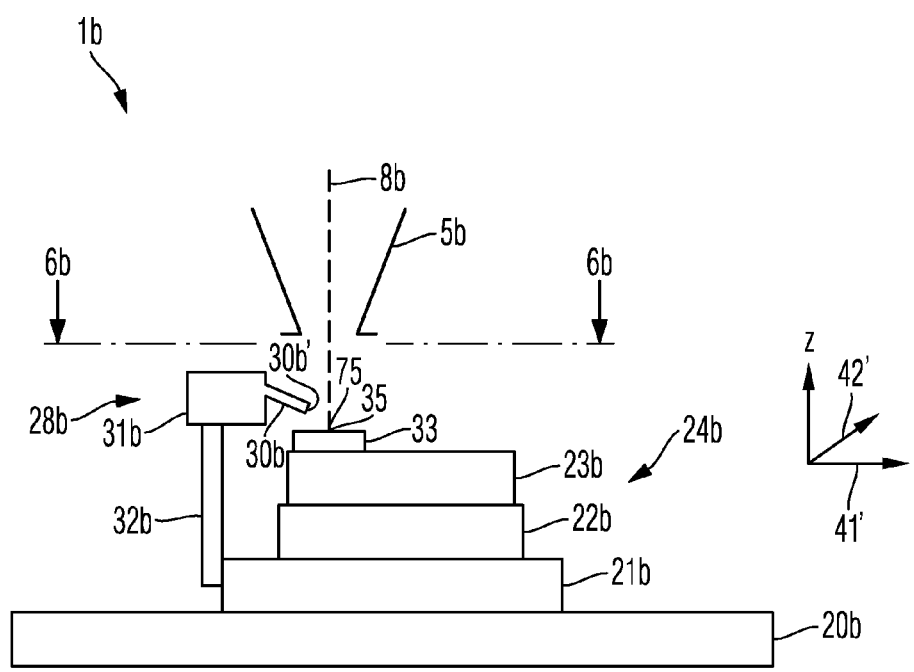
Figure 6B:
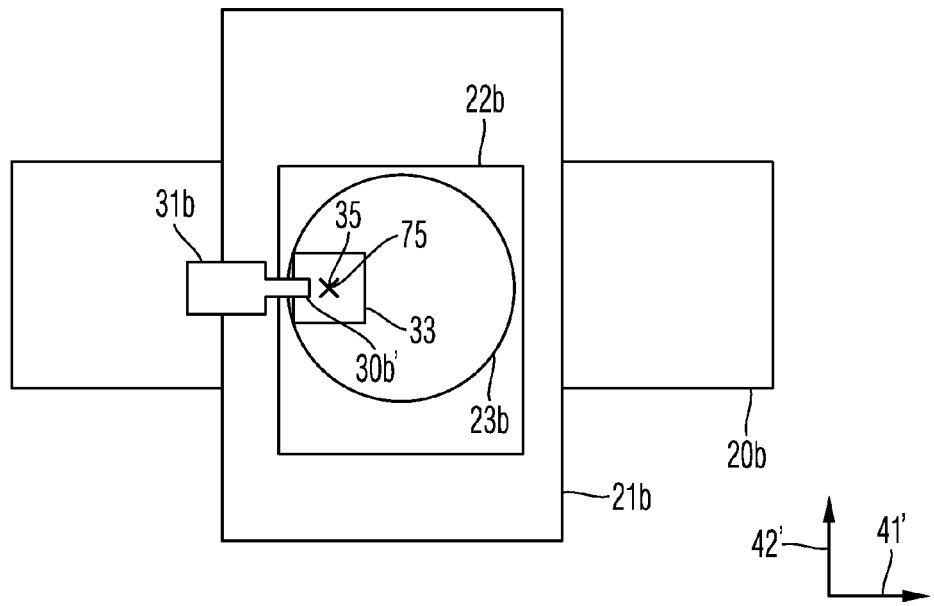
Figure 6C:
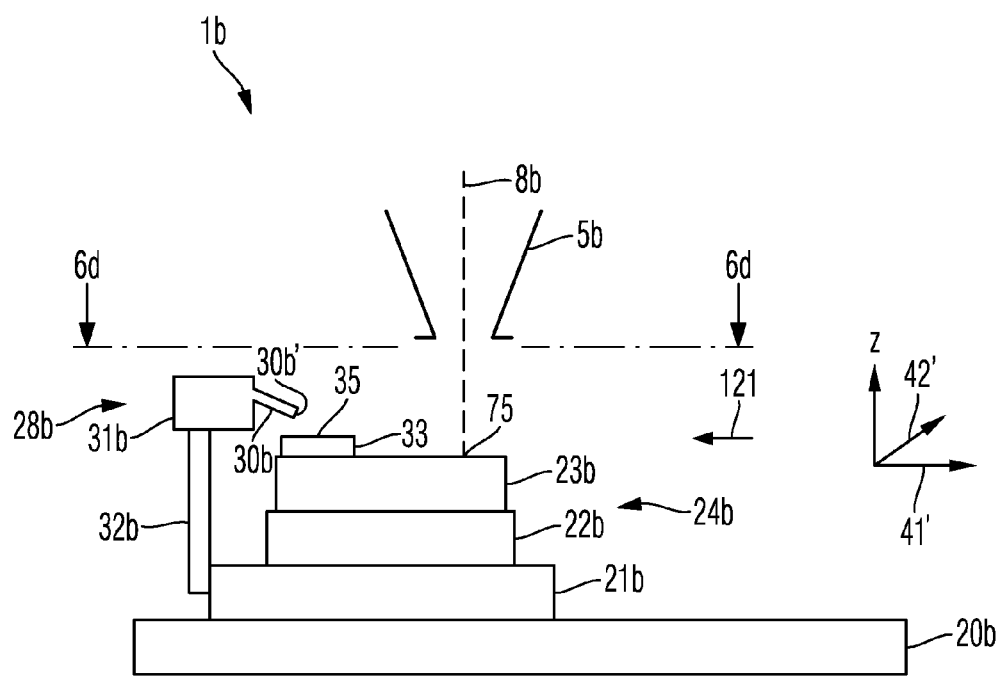
Figure 6D:
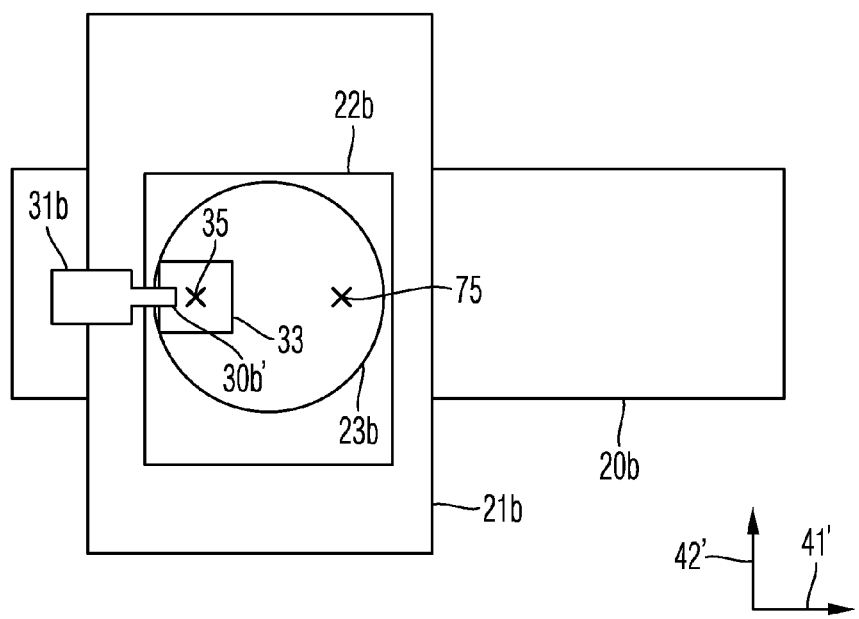
Figure 6E:
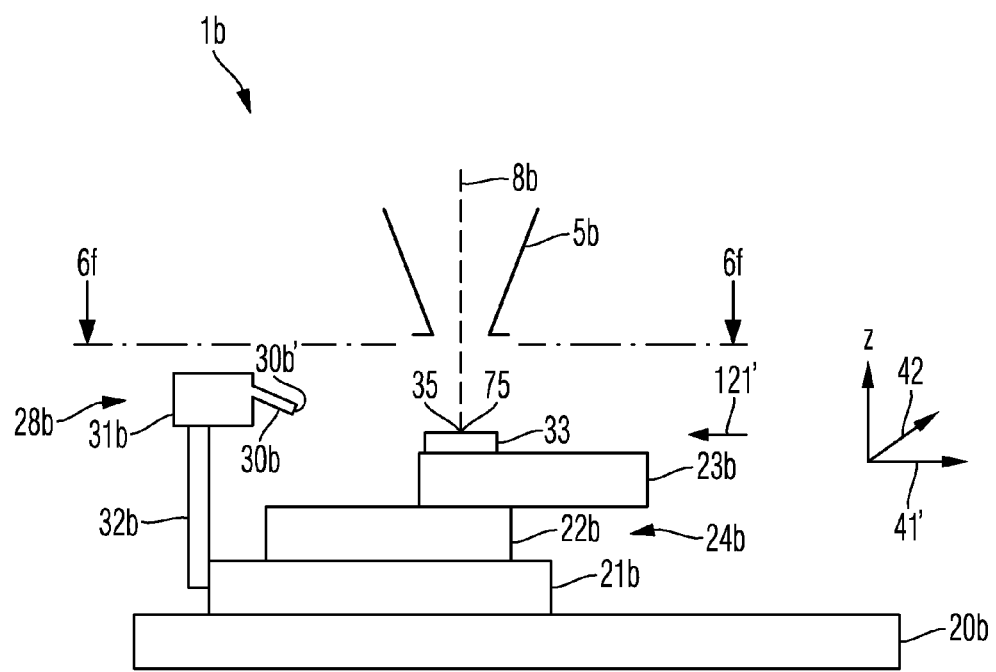
Figure 6F:
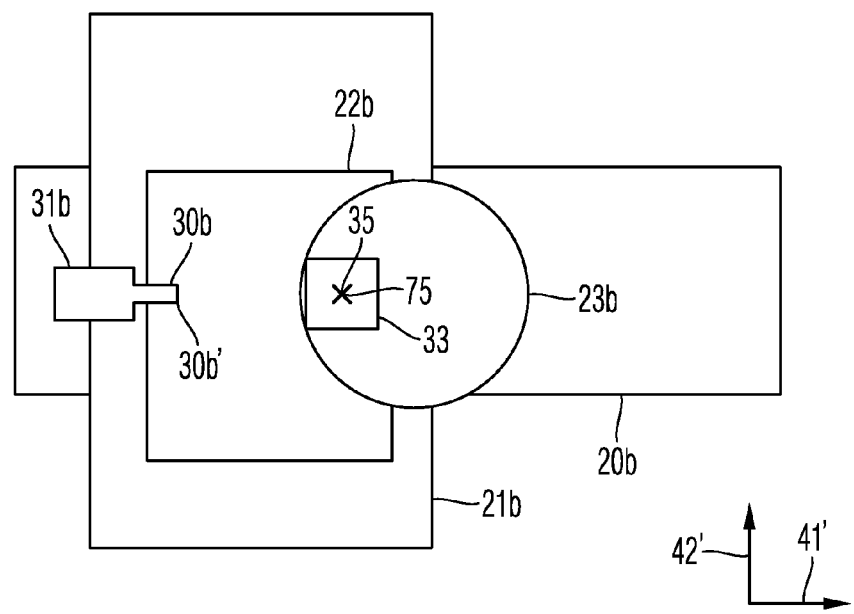

FIG. 6f show an embodiment of a processing system according to the present invention and steps of an embodiment of a processing method according to the present invention, respectively.

FIG. 1 illustrates in a sectional view a system 1 for processing a surface of an object according to an embodiment of the present invention. The system 1 comprises an electron source 3 adapted as cathode for generating an electron beam 8 along an axis 15. Further, the system 1 comprises focussing/deflection elements 19 for deflecting and focussing the electron beam 8. The electron beam 8 travels inside a beam tube 5 that is connected via an electrode terminal 7 to a voltage source. Thereby, a predetermined potential may be applied to the beam tube 5, for example +8 kV. The potential applied to the beam tube 5 causes generating an electric field in the space between the electron source 3 and the beam tube 5 and within part of the beam tube 5 that accelerates the electrons towards the surface 33a of the object 33. Thereby, the electron beam travels along the axis 15 such that an object field 75 of the electron beam is located at the processing location 35 of the surface 33a of the object 33. The object field of the electron beam tube is also denoted as point 75 of impingement of the electron beam 8.

For focussing the electron beam the focussing lens 11 is arranged around the electron beam 8 in an annular manner. The focussing lens 11 is a combination of a magnetic lens and an electrostatic immersion lens. Thereby, the magnetic lens comprises an inner pole piece 10 and an outer pole piece 9. By current flow in the coil 13 a magnetic flow through the pole pieces 9, 10 evolves by induction so that a magnetic field exits in the region of an axial gap 16. This magnetic field causes focussing the electron beam 8 to an object field 75 of the electron beam column in which in FIG. 1 the processing location 35 of the surface 33a of the object 33 is arranged.

An electrode plate 18 may be connected via an electrode terminal 18' to a voltage source to apply a potential to electrode plate 18. By applying an appropriate voltage between the beam tube 5 and the electrode plate 18 it is possible to decelerate the primary electrons exiting from the electron source 3 and initially being accelerated by the electric field between the electron source and the beam tube 5 to a primary energy of less than 8 keV before impinging at the location 35. An energy of e.g. 1 keV is suitable to perform deposition of material or ablation of material at the location 35 of the surface 33a of the object 33 upon supplying a reaction gas. However, also higher energies are possible.

A further function of the electrode plate 18 is to establish a pulling field between the surface 33a of the object 33 and the electrode plate 18 to allow electrons emanating from the object 33 upon impingement of the electron beam 8 to reach the electron detector 17. By scanning a portion of the surface 33a of the object 33 around the processing location 35 and detecting the emanating electrons using the detector 17 is possible, to acquire an electron microscopic image from the surface region around the processing location 35. The in such a way acquired electron microscopic image thus reflects a processing state of the surface region of the object and thus allows controlling further processing.

In this embodiment the electron detector 17 is configured as an inlens detector. Other embodiments provide an electron detector outside the focussing lens 11. All previously described elements for generating, deflecting, focussing and detecting electrons form the electron beam tube 26.

During processing and inspection, respectively, the object 33 using the processing system 1 of the present invention the object 33 is hold at an object holder 24. The object holder 24 comprises a base 20, a first table 21, a second table 22 and a third table 23. Using an actuator 41 the first table 21 is displaceable relative to the base 20 along a first direction 41'. Thereby, the base 20 is fixedly connected to the electron beam column 26, typically via a wall of the vacuum vessel. Via an actuator 42 the second table 22 is displaceable relative to the first table 21 in a second direction 42'. Via an actuator 43 the third table 23 is rotatable relative to the second table 22 around an axis 43'.

The processing system 1 is confined by a vacuum vessel 2 that may be evacuated using suitable vacuum pumps. The actuators 41, 42 and 43 are connected to a controller outside the vacuum vessel 2 to perform displacements of the tables 21, 22 and 23 relative to each other and relative to the base 20, respectively. Thus, such displacements are enabled during operation of the electron beam column. Instead of the actuators 41, 42 and 43 mechanical drives may employed.

The processing system 1 further comprises a gas supply apparatus 28. The gas supply apparatus 28 comprises a cannula 30 having a cannula exit opening 30', a gas reservoir 31, adjustment screws 44$_1$, 44$_2$ and 44$_3$ and a holder or leverage 32. Instead of adjustment screws 44$_1$, 44$_2$ and 44$_3$ other adjustment elements may be provided. Thereby, the holder 32 of the gas supply apparatus 28 is fixedly but demountedly, e.g. via plug holder or bayonet lock, connected to the first table 21 of the object holder 24. The cannula exit opening 30' of the cannula 30 of the gas supply apparatus 28 is thereby directed to the processing location 35 of the surface 33a of the object 33 or is arranged in proximity of the processing location 35, to selectively supply reaction gas to the processing location 35.

In the embodiment illustrated in FIG. 1 concurrently the electron beam 8 impinges onto the processing location 35 of the surface 33a of the object 33 to activate reaction gas molecules or reaction gas elements adsorbed at the surface 33a of the object 33 or reaction gas molecules or reaction gas elements present in a space around the processing location 35, to perform deposition of material or ablation of material at the processing location 35. Also, upon supplying such as an inert gas being ionized by the electron beam and impinging onto the surface a charge neutralization of the surface may be caused.

To locally adjust the gas supply apparatus 28 to arrange the cannula exit opening 30' in the proximity of the point 75 of impingement of the electron beam onto the surface 33a of the object 33 an adjustment screw 44$_1$ for adjustment, such as a displacement of the cannula exit opening 30' in the first direction 41', an adjustment screw 44$_2$ for adjustment of the cannula exit opening 30' in the second direction 42' and an adjustment screw 44$_3$ for adjustment of the cannula exit opening 30' in a third direction z perpendicular to the first and the second directions are provided. Such adjustments may be performed via translations and/or rotations. Typically however, the adjustment screws are not controllable from outside the vacuum vessel 2, but merely provided to allow an initial adjustment of the cannula exit opening 30' relative to the point 75 of impingement of the electron beam 8. In other embodiments, however the adjustment screws may be controllable from outside. During actual operation of processing or inspecting an object, a location of the cannula exit opening 30' relative to the first table 21 is fixed.

Figure 2B:
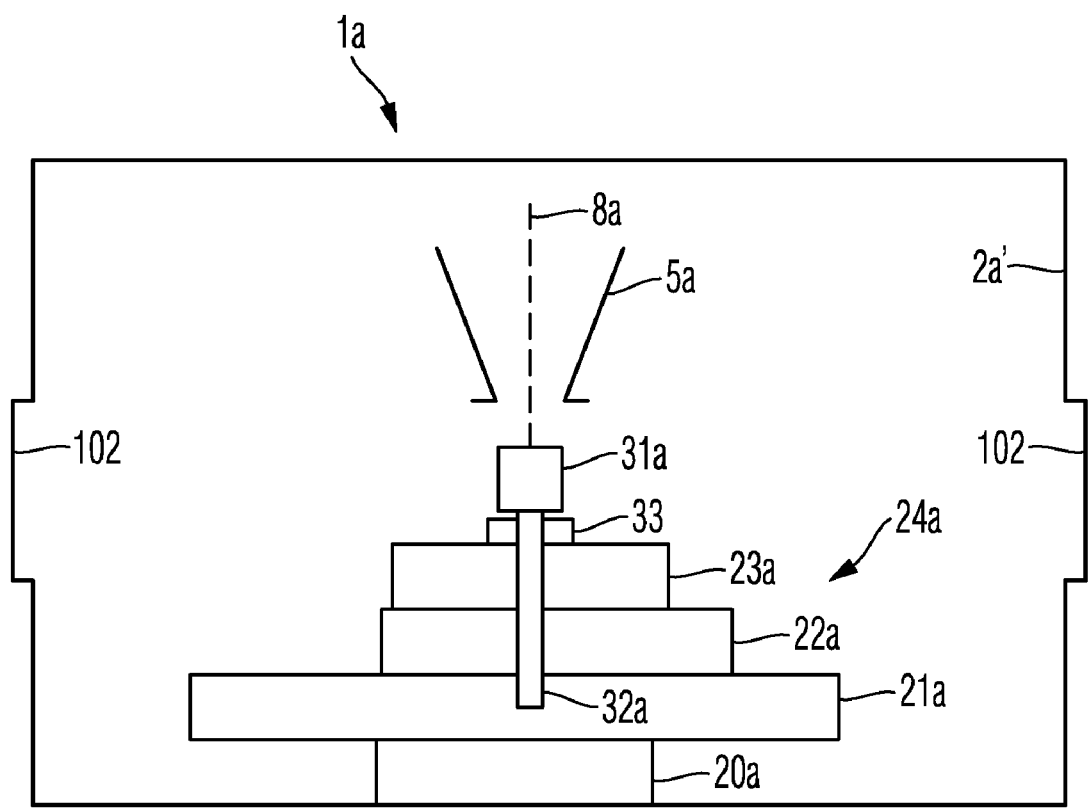

FIGS. 2a, 2b and 2c show views from different directions perpendicular relative to each other of a further embodiment 1a of a processing system according to the present invention. FIG. 2a shows a side view of the processing system 1a in a same view as the processing system 1 illustrated in FIG. 1. Same or similar components in both Figs. are denoted with same reference numbers, wherein in FIGS. 2a, 2b and 2c the letter "a" is added to some of these reference numbers. The vacuum vessel however is noted as reference signs 2a'. A function of the similar components is analogous to the function described with reference to FIG. 1. Thus, a description of these components may be taken from the description of FIG. 1.

FIG. 2c illustrates a view of the processing system 1a in a direction of the arrows 2c illustrated in FIG. 2a. FIG. 2b shows a view of the processing system 1a according to the present invention in a direction of the arrows 2b illustrated in FIG. 2c. Further, in FIGS. 2a, 2b and 2c windows 102 are illustrated which are provided in walls of the vacuum vessel 2a', to allow inspection of the inner space of the vacuum vessel 2a' from outside.

FIGS. 3a, 3b, 3c, 3d, 3e and 3f illustrate an embodiment of a processing method according to the present invention. The pairs of FIGS. 3a and 3b, 3c and 3d, as well as 3e and 3f, respectively, show a side view and a plan view, respectively, of the processing system 1a according to the present invention during different method steps in analogous way as the pair of FIGS. 2a and 2c.

FIG. 3a illustrates that initially a processing location 35 is positioned such that the electron beam impinges on this location. Thus, the location 35 of the object 33 is positioned in an object field 75 of the electron beam column 26. Concurrently, the cannula exit opening 30a' is arranged close processing location 35 to supply gas from the gas reservoir 31a to the processing location 35. Thus, reaction gas present within a space around the processing location 35 or being adsorbed at the surface of the object at the processing location 35 is activated by the electron beam 8 for causing deposition of material onto the surface of the object 33 or causing ablation of material from the surface of the object 33 or for causing charge compensation of surface charges at the surface of the object 33.

Hereby it is desirable to assess a processing state of the processing location 35 of the object 33 to determine whether a desired processing progress of the processing location 35 is achieved. To enable this without concurrently causing activation of the reaction gas by the particle beam initially the first table 21a is displaced relative to the base 20a in a direction of the arrow 121 such that the cannula exit opening 30a' of the cannula 30a of the gas supply apparatus 28a is arranged spaced apart from the point 75 of impingement of the electron beam. The state after such a displacement is illustrated in FIG. 3c in a side view and in FIG. 3d in a plane view. Since the gas supply apparatus 28a and thus the cannula exit opening 30a' is fixedly connected to the first table 21a via leverage 32a, for displacement of the gas supply apparatus 28a a translation of the table 21a relative to the base 20a is required. Synchronously with a displacement of the first table 21a also the second table 22a mounted thereon as well as the third table 23a mounted on the second table 22a are translated in the same way. Thus, also the processing location 35 of the object 33 is translated to a location arranged spaced apart from point 75 of impingement of the electron beam 8.

To arrange the processing location 35 in proximity of the point 75 of impingement of the electron beam in a next method step of the method for processing an object, the third table 23a is rotated relative to the second table 22a (indicated by the arrow 123 in FIG. 3e) until the processing location 35 coincides with the point 75 of impingement of the electron beam 8. The state after such a rotation is shown FIGS. 3e and 3f. In the method illustrated in the FIGS. 3a to 3f a rotation angle amounts to 180°. Depending on an arrangement of the processing location 35 the rotation angle may be larger or smaller than 180°. From the FIGS. 3e to 3f it is apparent that after rotating the third table 23a relative to the second table 22a the cannula exit opening 30a' is arranged spaced apart from the point 75 of impingement of the electron beam 8 and also spaced apart from the processing location 35 of the object 33. In this arrangement illustrated in FIGS. 3e and 3f thus an electron microscopic image of the processing location 35 of the object 33 may be acquired using the electron beam 8 scanning a portion at the processing location 35 without involving a significant reaction, since there is not a sufficient amount of reaction gas present.

Instead of initially translating the first table 21a and then rotating the third table 23a also initially the third table 23a may be rotated and then the first table 21a may be translated or both operations may concurrently be performed.

Then the electron microscopic image may be considered to determine a processing state or a processing progress of the processing location 35 of the object 33. Depending on the determined processing state or processing progress further deposition of material at the processing location 35 or ablation of material from the processing location 35 may be required. In this case the third table 23a may be rotated back relative to the second table 22a to again reach from a state illustrated in FIGS. 3e and 3f to a state illustrated in FIGS. 3c and 3d. From the last-mentioned state then the first table 21a is translated back relative to the base 20a to a state illustrated in FIGS. 3a and 3b. This state is characterized by an arrangement, wherein the processing location 35 of the object 33 is located in a point 75 of impingement of the electron beam 8 and wherein the cannula exit opening 30a' of the gas supply apparatus 28a is arranged in proximity of the processing location 35 such as to enable to activate gas close to the processing location 35 by the electron beam 8 to process the processing location 35.

As illustrated in a plan view of the processing system 1a according to the present invention in the FIGS. 3b, 3d and 3f, a translation of the first table 21a relative to the base 20a is performed in the first direction 41' and a translation of the second table 22a relative to the first table 21a is enabled in a direction 42'. It is apparent that the translation directions 41' and 42' are perpendicular relative to each other.

As soon as processing a processing location 35 is completed a further processing location may be arrived as follows: the second table 22a is translated relative to the first table 21a in a direction 42' and the third table 23a is rotated relative to the second table 22a around an axis z, until the further processing location is located within point 75 of impingement of the electron beam 8. Because for this arriving the further processing location 35 the first table 21a was not translated relative to the base 20a, the cannula exit opening 30a' of the gas supply apparatus 28a remains at an unchanged location relative to the point 75 of impingement of the electron beam to thus be arranged in proximity to the further processing location. Thus, a processing may be performed at practically arbitrary locations of the object to there perform depositions of material or ablations of material. Further, also this further processing location may be inspected by the electron beam 8 upon substantial absence of reaction gas by translating first table 21a relative to the base 20a and rotating the third table 23a relative to the second table 22a, to thus acquire an electron microscopic image of this further processing location.

FIGS. 4a and 4b schematically illustrate explosion drawings of embodiments 28b and 28c of gas supply apparatuses according to the present invention. FIG. 4a illustrates a gas supply apparatus 28b comprising a substance reservoir 31b comprising a substance 31b', an intermediate piece 58b, an angle piece 50b and a cannula 30b. The gas supply apparatus 28b further comprises a connection piece 57b being connected to the leverage 32b. The leverage 32b may be mounted using a screw 62 at a sample holder of an electron microscope. In embodiments of the present invention the gas supply apparatus 28b is mounted at the first table 21 and 21a of the embodiments 1 and 1a, illustrated in the FIGS. 1 and 2, respectively. Thus, a fixed connection between the gas supply apparatus 28b and the first table 21 and 21a, respectively, may be ensured.

The cannula 30b of the gas supply apparatus 28b is made from a non-magnetizable, electrically conductive material. In a first section extending from the cannula exit opening 30b' the cannula 30b assumes a pipe shape having a small cross-sectional area. A diameter of the cross-sectional area of this section of the cannula 30b amounts to around 1 to 2 mm. In a second section towards a coupler 54b the cross-sectional area of the cannula enlarges to exhibit a diameter of around 5 to 8 mm.

Using coupling piece 54b the cannula 30b may be gas-tightly connected to the angle piece 50b via a coupling piece 51b. The angle piece 50b is made from an inert, corrosion-resistant material (for example stainless steel). Using the angle piece 50b a large setting angle can be achieved so that cannula 30b does not interfere with other components within the processing systems 1 and 1a, respectively. The bending angle provided by the angle piece may amount to between 0 to 90°. The angle piece 50b may be gas-tightly connected to the intermediate piece 58b via the coupling piece 52b of the angle piece 50b and the coupling piece 56 of the intermediate piece 58b. The intermediate piece 58b in turn may be gas-tightly connected to the substance reservoir 31b via the coupling piece 60b of the intermediate piece 58b and the coupling piece 61b of the reservoir 31b.

Via the tube-shaped opening 59b of the intermediate piece 58b, the tube-shaped opening 53b within the angle piece 50b and the tube-shaped opening 55b of the cannula 30b thus substance 31b' present within the substance reservoir 31b may arrive at the cannula exit opening 30b'. This substance 31b' may be stored within the substance reservoir 31b in a solid, a liquid or a gaseous state. Thus, a reaction gas forming from the substance may be supplied to a processing location of an object located in proximity of the cannula exit opening 30b'.

The substance reservoir is made from an inert, corrosion-resistant material (e.g. glass or stainless steel). A substance reservoir made from glass is advantageous, as at any time the filling state may be monitored. Further, in the substance reservoir instead of a gas or additionally to a gas, a fluid material or a solid material, such as a precursor material, may be contained. This precursor material often is easily degradable, wherein monitoring the state of the precursor material is advantageously enabled upon utilization of a glass-made substance reservoir 31b. A solid precursor material evaporates during operation within the processing system 1 and 1a, respectively, by its own vapor pressure, and flows through the just a few centimeter long glass pipe system formed by the tube-shaped cavities towards the cannula exit opening 30b'.

A total extension of the gas supply apparatus 28b in a direction of maximal extension amounts to about 5 to 15 cm. Due to its small size the gas supply apparatus 28b is simply installable in a vacuum vessel. It is not required to provide a particular flange to supply gas from outside the vacuum vessel to the gas supply apparatus.

FIG. 4b shows a further embodiment 28c of a gas supply system according to the present invention. Similar components are again denoted by similar reference signs and their description may be taken from the description of FIG. 4a.

Additionally to the components of the embodiment 28b of a gas supply apparatus illustrated in FIG. 4a the gas supply apparatus 28c illustrated in FIG. 4b comprises a locking device 64c again gas-tightly coupled between the substance reservoir 31c and the intermediate piece 58c by coupling pieces 62c and 66c. The locking device 64c may for example comprise a locking tap or a locking valve made from inert, corrosion-resistant material (for example stainless steel). The locking device 64c may purely mechanically, pneumatically or electromechanically be actuated by an actuator or may be a miniature solenoid valve. Controlling the locking device 64c from outside the vacuum vessel 2 and 2a, respectively, is enabled via the signal line 67.

A further difference between the gas supply apparatus 28b illustrated in FIG. 4a and the gas supply apparatus 28c illustrated in FIG. 4b is that the gas supply apparatus 28c further comprises adjustment elements $44c_1$, $44c_2$, $44c_3$. These adjustment elements enable translating the cannula exit opening 30c' in three space directions $46_1$, $46_2$ and $46_3$, being perpendicular to each other. After fixing the gas supply apparatus 28c at the first table 21 or 21a of the processing system 1 or 1a thus the cannula exit opening 30c' may be arranged in proximity of an object field of the electron beam 8 or 8a by translating it in the three space directions oriented perpendicular to each other. During an operation of the processing system 1 or 1a the adjustment elements $44c_1$, $44c_2$ and $44c_3$ need not to be actuated. In particular, an adjustment range of these adjustment elements is 10 to 50 times smaller than a translation range of the first table 21 relative to the base 20 or a translation range of the first table 21a relative to the base 20a.

FIGS. 5a, 5b, 5c and 5d show embodiments 30d, 30e, 30f, and 30g, respectively, of cannulas of gas supply apparatuses according to the present invention. The illustrated cannulas have different shapes and sizes of a longitudinal section and different shapes and sizes of a cross-section. In particular the cannula 30f exhibits an enlargement of a cross-section in the region of the cannula exit opening 30f' and the cannula 30g exhibits a bend in a first section in front of the cannula exit opening 30g'.

When employing a valve within the gas supply apparatus controlled by an external controller the delivery of gas from the gas supply apparatus may also be interrupted from outside during the processing to inspect the processing location by acquiring an electron microscopic image without thereby concurrently undesiredly supplying reaction gas. Further, the gas supply system may comprise a heating block or a cooling block with a Peltier element, to enable heating or cooling the gas reservoir or the entire gas supply apparatus. Thereby, an increase of the vapor pressure or a decrease of the vapor pressure, such as for controlling a gas flow rate, is enabled. Thus, extremely low volatile as also extremely highly volatile precursor materials may be used. As connection pieces gas-tight connections (for example cone-shaped, for example LuerLock) may be employed.

FIG. 6a, 6b, 6c, 6d, 6e, and 6f illustrate an embodiment 1b of a processing system according to the present invention and steps of an embodiment of a processing method according to the present invention, respectively. The pairs of the FIGS. 6a and 6b, 6c and 6d as well as 6e and 6f, respectively, show a side view and a plan view, respectively, of the processing system 1b according to the present invention during different method steps in an analogous way as the FIGS. 2a and 2c, respectively. The processing system 1b has many components in common with the embodiments 1 and 1a of the processing system according to the present invention illustrated in FIGS. 1 and 2. A difference to the previously described embodiments of the processing system according to the present invention however resides in the object holder 24b for holding object 33. As the holders 24 and 24a of the embodiments 1 and 1a, respectively, also the object holder 24b comprises a base 20b, a first table 21b, a second table 22b and a third table 23b. The first table 21b is translatable relative to the base 20b along a first direction 41'. This translation may also be performed by an actuator. The second table 22b is translatable relative to the first table 21b in a second direction 42'. So far the object holder 24b substantially corresponds to the object holders 24 and 24a of the embodiments 1 and 1a of the processing system according to the present invention, respectively. In the embodiment illustrated in the FIGS. 6a to 6f however the third table 23b is not rotatably displaceable relative to the second table 22b, but it is translatable relative to the second table 22b in the first direction 41'.

FIG. 6a illustrates that initially a processing location 35 positioned in proximity of the cannula exit opening 30b' as well as in the point 75 of impingement of the electron beam 8b. Thus, the object 33 may be processed at the processing location 35 by the reaction gas activated by the electron beam 8b.

To inspect a processing state of the processing location 35, in a second method step illustrated in the FIGS. 6c and 6d the first table 21b is translated relative to the base 20b in a direction of the arrow 121 so that the cannula exit opening 30b' of the cannula 30b of the gas supply apparatus 28b is arranged spaced apart from the point 75 of impingement of the electron beam 8b. At the same time the point 75 of impingement of the electron beam 8b is arranged spaced apart from the processing location 35 of the object 33.

To inspect the processing location 35 of the object 33 in a third processing step illustrated in the FIGS. 6e and 6f the third table 23b is translated relative to the second table 22b in a direction of the arrow 121', until point 75 of impingement of the electron beam 8b is located at the processing location 35 of the object 33. Thereby, the cannula exit opening 30b' is spaced arranged apart from the point 75 of impingement of the electron beam 8b. Thus, upon substantial absence of reaction gas an electron microscopic image of the processing location 35 may be acquired to determine a processing state of the processing location 35. As in the method for processing an object illustrated in the FIGS. 3a to 3f this electron microscopic image may be considered to decide, whether a further processing of the processing location 35 is necessary.

According to a further embodiment of the present invention a processing system is provided, wherein the third table is translationally displaceable relative to the second table and rotatably mounted relative to the second table.

In the above-described embodiments of a system for processing an object alternatively gas supply apparatuses 28, 28a, 28b, 28c illustrated in FIGS. 1, 2a to 2c, 4a and 4b, respectively, may be employed. Depending on requirements the cannulas 30d, 30e, 30f or 30g illustrated in FIGS. 5a, 5b, 5c and 5d, respectively, may be employed.

The invention claimed is:

1. A system for processing an object, the system comprising:
 a particle beam column having an objective lens;
 an object holder for positioning an object to be processed in front of the objective lens; and
 a gas supply apparatus having a cannula for supplying gas to the object positioned in front of the objective lens;
 wherein the object holder comprises:
  a base stationary with respect to the particle beam column,
  a first table mounted on the base and translationally displaceable relative to the base in a first direction,
  a second table mounted on the first table and translationally displaceable relative to the first table in a second direction, and
  a third table mounted at the second table and displaceable relative to the second table,
 wherein the cannula is fixed to the first table.

2. The system according to claim 1, further comprising a first actuator to displace the first table relative to the base.

3. The system according to claim 1, further comprising a second actuator to displace the second table relative to the first table.

4. The system according to claim 1, further comprising a third actuator to displace the third table relative to the second table.

5. The system according to claim 1, wherein at least one of the first, the second and the third actuator may be actuated during operation of the particle beam column.

6. The system according to claim 1, wherein at least one of a position and an orientation of the cannula is adjustable relative to the first table.

7. The system according to claim 1, wherein the gas supply apparatus comprises a substance reservoir for accommodation of a reserve of a substance which may be supplied via the cannula in a form of gas.

8. The system according to claim 7, wherein the particle beam column and the substance reservoir are arranged within a common vacuum vessel.

9. The system according to claim 7, wherein the substance reservoir is fixed at the first table together with the cannula.

10. The system according to claim 7, wherein the gas supply apparatus comprises a locking valve arranged between the substance reservoir and the cannula.

11. The system according to claim 10, wherein the substance reservoir comprises an actuator for actuating the locking valve during operation of the particle beam column.

12. A processing method comprising:
   a positioning a portion of an object in an object field of a particle beam column, wherein an exit opening of a cannula is arranged close to the object field;
      wherein the positioning of the portion comprises:
         displacing a first table mounted at a base relative to the base wherein the base is stationary with respect to the particle beam column, and wherein the cannula is fixed to the first table,
         displacing a second table mounted at the first table relative to the first table, and
         displacing a third table mounted at the second table relative to the second table, then
   b processing the object by supplying gas via the cannula and activating the gas using the particle beam column; then
   c completing the processing the object by moving away the cannula such that its exit opening is arranged spaced apart from the object field of the particle beam column by displacing the first table relative to the base;
   d positioning the portion of the object in the object field of the particle beam column, wherein the exit opening of the cannula is arranged spaced apart from the object field by displacing the third table relative to the second table; and
   e acquiring a microscopic image of the portion of the object using the particle beam column.

13. The processing method according to claim 12, wherein during the processing the object and the acquiring the microscopic image gas exits from the cannula.

14. A system for processing an object, wherein the system is designed to perform the method according to claim 13.

15. A processing method comprising:
   positioning a portion of an object within an object field of a particle beam column and positioning an exit opening of a cannula close to the object field, wherein a reaction gas is allowed to flow out of the exit opening of the cannula;
   processing the object by activating the reaction gas using a particle beam generated by the particle beam column and directed to the portion of the object positioned within the object field of the particle beam column while the exit opening of the cannula is positioned close to the object field and the reaction gas is allowed to flow out of the exit opening of the cannula; then
   moving the exit opening of the cannula away from the object field, wherein the reaction gas is still allowed to flow out of the exit opening of the cannula;
   acquiring a microscopic image of the portion of the object by directing the particle beam generated by the particle beam column to the portion of the object positioned within the object field of the particle beam column and detecting particles emanating from the object field while the exit opening of the cannula is removed away from the object field and the reaction gas is still allowed to flow out of the exit opening of the cannula.

16. The processing method according to claim 15, wherein the moving of the exit opening of the cannula away from the object field is performed such that the processing of the object is stopped.

17. The processing method according to claim 15, wherein the reaction gas activated by the particle beam produces at least one of a material deposition and a material ablation on a surface of the object during the processing of the object, and wherein the at least one of the material deposition and the material ablation is insignificant during the acquiring of the microscopic image.

18. The processing method according to claim 17, wherein the moving of the exit opening of the cannula away from the object field is performed such that the at least one of the material deposition and material ablation gets insignificant.

19. A system for processing an object, wherein the system is designed to perform the method according to claim 15.

* * * * *